(12) United States Patent
Ooyabu et al.

(10) Patent No.: US 9,450,160 B2
(45) Date of Patent: Sep. 20, 2016

(54) REFLECTING RESIN SHEET, LIGHT EMITTING DIODE DEVICE AND PRODUCING METHOD THEREOF

(71) Applicant: NITTO DENKO CORPORATION, Ibaraki-shi, Osaka (JP)

(72) Inventors: Yasunari Ooyabu, Osaka (JP); Tsutomu Nishioka, Osaka (JP); Hisataka Ito, Osaka (JP); Toshiki Naito, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/831,305

(22) Filed: Aug. 20, 2015

(65) Prior Publication Data

US 2015/0357536 A1 Dec. 10, 2015

Related U.S. Application Data

(62) Division of application No. 13/446,517, filed on Apr. 13, 2012.

(30) Foreign Application Priority Data

Apr. 14, 2011 (JP) .................. 2011-089922

(51) Int. Cl.
*H01L 33/00* (2010.01)
*H01L 33/60* (2010.01)
*H01L 33/54* (2010.01)
(Continued)

(52) U.S. Cl.
CPC .............. *H01L 33/60* (2013.01); *H01L 24/97* (2013.01); *H01L 25/0753* (2013.01); *H01L 33/505* (2013.01); *H01L 33/54* (2013.01);

*H01L 33/56* (2013.01); *H01L 2224/16225* (2013.01); *H01L 2924/12041* (2013.01); *H01L 2924/12042* (2013.01); *H01L 2924/15787* (2013.01); *H01L 2924/181* (2013.01); *H01L 2933/005* (2013.01); *H01L 2933/0041* (2013.01); *H01L 2933/0058* (2013.01)

(58) Field of Classification Search
CPC combination set(s) only.
See application file for complete search history.

(56) References Cited

U.S. PATENT DOCUMENTS

| | | |
|---|---|---|
| 2005/0139851 A1 | 6/2005 | Sato |
| 2006/0034084 A1 | 2/2006 | Matsuura et al. |

(Continued)

FOREIGN PATENT DOCUMENTS

| | | |
|---|---|---|
| JP | 2005-191420 A | 7/2005 |
| JP | 2007-019096 A | 1/2007 |

(Continued)

OTHER PUBLICATIONS

Extended European Search Report dated Jul. 25, 2014 issued by the European Patent Office in counterpart European application No. 12161747.6.

(Continued)

*Primary Examiner* — Robert Bachner
(74) *Attorney, Agent, or Firm* — Sughrue Mion, PLLC

(57) ABSTRACT

A reflecting resin sheet provides a reflecting resin layer at the side of a light emitting diode element. The reflecting resin sheet includes a release substrate and the reflecting resin layer provided on one surface in a thickness direction of the release substrate. The reflecting resin layer is formed corresponding to the light emitting diode element so as to be capable of being in close contact with the light emitting diode element.

5 Claims, 9 Drawing Sheets

(51) Int. Cl.
*H01L 33/50* (2010.01)
*H01L 33/56* (2010.01)
*H01L 23/00* (2006.01)
*H01L 25/075* (2006.01)

(56) References Cited

U.S. PATENT DOCUMENTS

| | | |
|---|---|---|
| 2008/0008831 A1 | 1/2008 | Kishimoto et al. |
| 2008/0193749 A1 | 8/2008 | Thompson et al. |
| 2008/0203415 A1 | 8/2008 | Thompson et al. |
| 2010/0059782 A1 | 3/2010 | Fujitomo et al. |
| 2010/0140648 A1 | 6/2010 | Harada et al. |
| 2010/0264438 A1 | 10/2010 | Suenaga |
| 2010/0311193 A1 | 12/2010 | Lin |
| 2010/0320479 A1 | 12/2010 | Minato et al. |
| 2011/0039978 A1 | 2/2011 | Kotani et al. |
| 2011/0309384 A1* | 12/2011 | Ito et al. ............... H01L 33/505 257/88 |
| 2013/0056781 A1 | 3/2013 | Suenaga |
| 2013/0062652 A1 | 3/2013 | Thompson et al. |
| 2013/0313602 A1 | 11/2013 | Suenaga |

FOREIGN PATENT DOCUMENTS

| | | |
|---|---|---|
| JP | 2009-188207 A | 8/2009 |
| JP | 2010-067641 A | 3/2010 |
| JP | 2010-518646 A | 5/2010 |
| JP | 2010-123802 A | 6/2010 |
| JP | 2010-192844 A | 9/2010 |
| JP | 2010-238846 A | 10/2010 |
| JP | 2010272847 A | 12/2010 |
| WO | 2009/069671 A1 | 6/2009 |

OTHER PUBLICATIONS

Notification of Reasons for Refusal dated Jun. 2, 2014 issued by the Japanese Patent Office in counterpart Japanese application No. 2011-089922.
Final Decision for Rejection issued in corresponding JP Application No. 2011-089922, dated Oct. 7, 2014.
Notification of First Office Action dated Aug. 25, 2015 from the State Intellectual Property Office of the People's Republic of China in counterpart application No. 201210110390.9.
Office Action dated Nov. 17, 2015 from the Taiwanese Intellectual Property Office issued in corresponding application No. 101112858.
Non-Final Office Action dated Dec. 11, 2015 from the United States Patent and Trademark Office issued in U.S. Appl. No. 14/932,150.
Final Office Action dated Mar. 21, 2016, issued by the United States Patent and Trademark Office in U.S. Appl. No. 14/932,150.
Office Action dated Jun. 21, 2016, from the Intellectual Property Office of Taiwan in counterpart application No. 101112858.
Office Action dated Jul. 26, 2016, from the USPTO in U.S. Appl. No. 14/932,150.

* cited by examiner

FIG.4
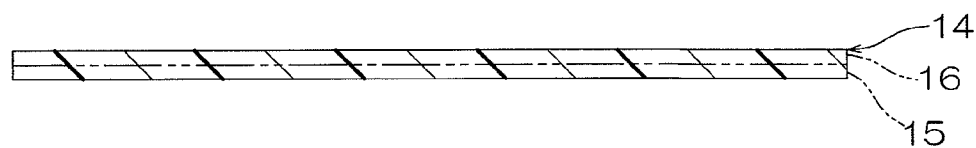
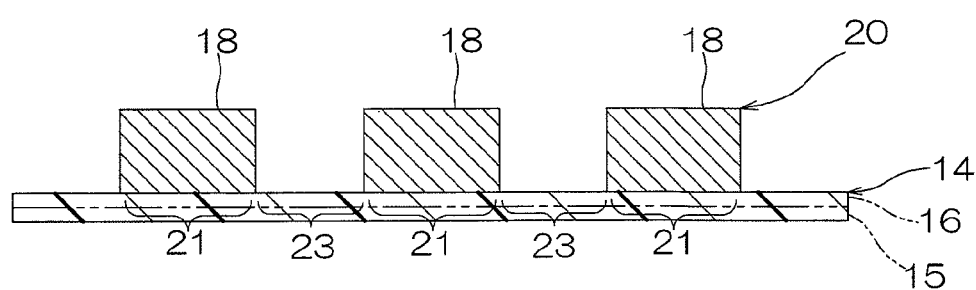
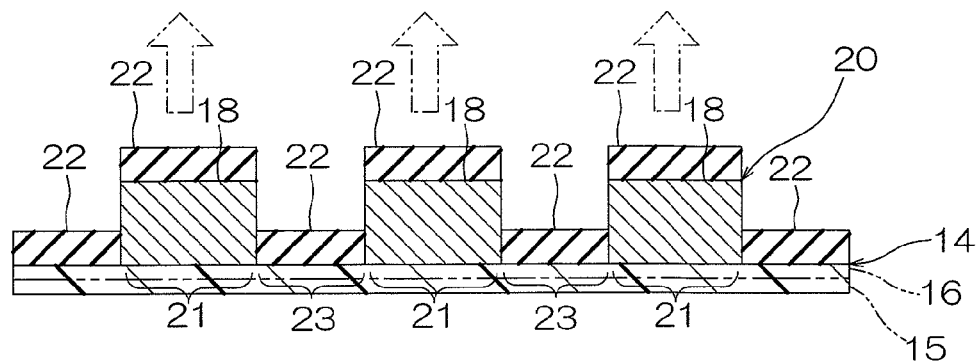

FIG.8
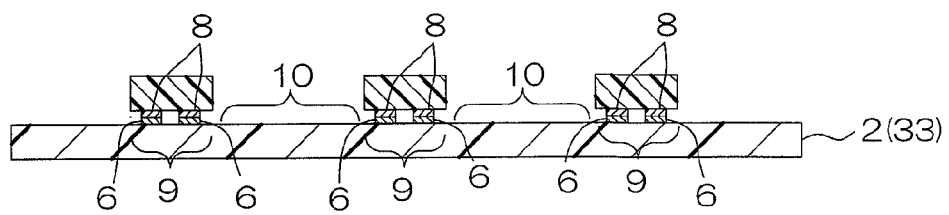
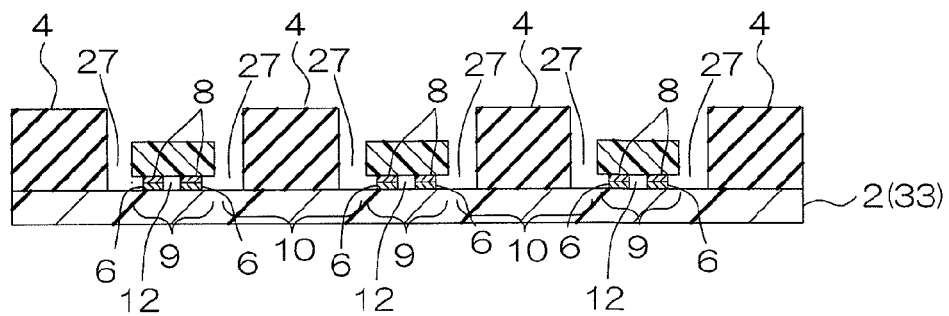
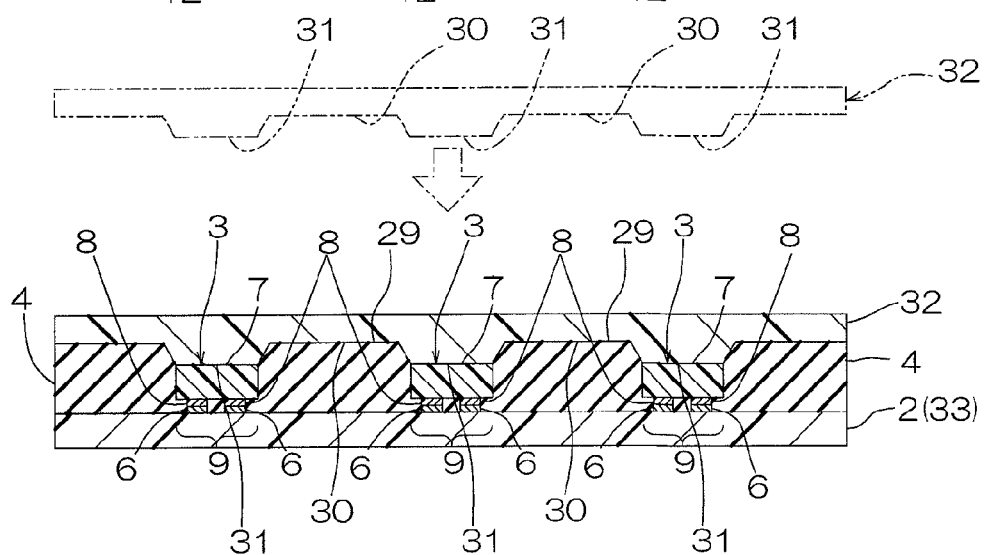

REFLECTING RESIN SHEET, LIGHT EMITTING DIODE DEVICE AND PRODUCING METHOD THEREOF

CROSS-REFERENCE TO RELATED APPLICATION

This is a divisional of U.S. application Ser. No. 13/446,517 filed Apr. 13, 2012, which claims priority from Japanese Application No. 2011-089922 filed on Apr. 14, 2011, the contents of all of which are hereby incorporated by reference into this application.

BACKGROUND OF THE INVENTION

1. Field of the Invention

The present invention relates to a reflecting resin sheet, a light emitting diode device, and a producing method thereof, to be specific, to a producing method of a light emitting diode device, a reflecting resin sheet used in the producing method, and a light emitting diode device obtained by the producing method of the light emitting diode device.

2. Description of Related Art

In recent years, as a light emitting device that is capable of emitting high-energy light, a white light emitting device has been known. In the white light emitting device, for example, a diode board; an LED (light emitting diode) laminated thereon, emitting blue light; a phosphor layer that can convert the blue light into yellow light and covers the LED; and an encapsulating layer that encapsulates the LED are provided. The white light emitting device emits high-energy white light by color mixing of the blue light emitted from the LED, which is encapsulated by the encapsulating layer and to which electric power is supplied from the diode board, transmitting through the encapsulating layer and the phosphor layer, and the yellow light that is converted in wavelength from a part of the blue light in the phosphor layer.

As a method for producing the white light emitting device, for example, the following method has been proposed (ref: for example, Japanese Unexamined Patent Publication No. 2005-191420).

The proposed method is as follows. That is, a base, which has a board portion and a white reflecting frame portion protruding from the circumference portion thereof toward the upper side, is first formed. Next, a semiconductor light emitting element is subjected to a wire bonding in a bottom portion of a concave portion, which is formed at the center of the board portion by the reflecting frame portion, so as to be spaced apart from the inner side of the reflecting frame portion.

Next, a mixture of a phosphor and an epoxy resin in a liquid state is filled in the concave portion by application, subsequently the phosphor is spontaneously precipitated in the bottom portion of the concave portion, and then the epoxy resin is heat cured.

In the white light emitting device obtained by the method proposed in Japanese Unexamined Patent Publication No. 2005-191420, the phosphor layer (a wavelength conversion layer) that contains the phosphor formed by a precipitation at high concentrations is defined in a region at the upper side of the semiconductor light emitting element and an encapsulating portion that contains the epoxy resin at high concentrations is defined in a region at the upper side of the phosphor layer.

In the white light emitting device, the semiconductor light emitting element radially emits the blue light. Of the emitted blue light, a part thereof emitted from the semiconductor light emitting element toward the upper side is converted into the yellow light in the phosphor layer and the remaining light transmits through the phosphor layer. The blue light emitted from the semiconductor light emitting element toward the side is reflected at the reflecting frame portion and then toward the upper side. The white light emitting device in Japanese Unexamined Patent Publication No. 2005-191420 emits the white light by color mixing of the blue light and the yellow light.

SUMMARY OF THE INVENTION

However, in the white light emitting device obtained by the producing method in Japanese Unexamined Patent Publication No. 2005-191420, there is a disadvantage that the semiconductor light emitting element is spaced apart from the reflecting frame portion, so that a part of the light emitted from the semiconductor light emitting element toward the side is absorbed in the encapsulating portion before being reflected at the reflecting frame portion and as a result, extraction efficiency of the light is reduced.

It is an object of the present invention to provide a light emitting diode device that is capable of improving extraction efficiency of light, a producing method thereof, and a reflecting resin sheet used in the producing method.

A reflecting resin sheet of the present invention, for providing a reflecting resin layer at the side of a light emitting diode element, includes a release substrate and the reflecting resin layer provided on one surface in a thickness direction of the release substrate, wherein the reflecting resin layer is formed corresponding to the light emitting diode element so as to be capable of being in close contact with the light emitting diode element.

In the reflecting resin sheet of the present invention, it is preferable that at one surface in the thickness direction of the release substrate, a portion in which the reflecting resin layer is provided is dented toward the other side in the thickness direction.

The method for producing a reflecting resin sheet of the present invention includes the steps of preparing the above-described reflecting resin sheet by providing a reflecting resin layer on one surface in a thickness direction of a release substrate, providing a light emitting diode element on one surface in the thickness direction of a diode board, and laminating the reflecting resin sheet on the diode board so that the reflecting resin layer is in close contact with the side surface of the light emitting diode element.

In the method for producing the light emitting diode device of the present invention, it is preferable that in the step of laminating the reflecting resin sheet on the diode board, an exposed portion that is exposed from the reflecting resin layer in the release substrate is allowed to be in close contact with one surface in the thickness direction of the light emitting diode element.

In the method for producing the light emitting diode device of the present invention, it is preferable that the step of preparing the reflecting resin sheet includes the steps of disposing a mask where a pattern including a plurality of covering portions disposed at spaced intervals to each other so as to correspond to the exposed portion and a bridge portion that is disposed between the covering portions is formed on one side in the thickness direction of the release substrate so that the covering portion is opposed to the exposed portion, forming the reflecting resin layer in an opposite pattern to that of the covering portion by applying a reflecting resin composition for forming the reflecting resin layer onto the release substrate via the mask, and removing the mask.

The method for producing a light emitting diode device of the present invention includes the steps of providing a light emitting diode element on one surface in a thickness direction of a base member, providing a reflecting resin layer, on one surface in the thickness direction of the base member, at the side of the light emitting diode element, and allowing a concave portion of a pressing member that is formed to be dented toward the other side in the thickness direction corresponding to the reflecting resin layer to press the reflecting resin layer, so that the reflecting resin layer is in close contact with the side surface of the light emitting diode element.

In the method for producing the light emitting diode device of the present invention, it is preferable that the step of providing the reflecting resin layer includes the steps of disposing a mask where a pattern including a plurality of covering portions disposed at spaced intervals to each other so as to correspond to the light emitting diode element and a bridge portion that is disposed between the covering portions is formed on one side in the thickness direction of the base member so that the covering portion is opposed to the light emitting diode element, forming the reflecting resin layer in an opposite pattern to that of the covering portion by applying a reflecting resin composition for forming the reflecting resin layer onto the base member via the mask, and removing the mask.

A light emitting diode device of the present invention includes a diode board, a light emitting diode element provided on one surface in a thickness direction of the diode board, and a reflecting resin layer that is in close contact with the side surface of the light emitting diode element.

In the light emitting diode device of the present invention, it is preferable that the reflecting resin layer is formed so that the thickness thereof is thicker than that of the light emitting diode element.

In the light emitting diode device of the present invention, it is preferable that the light emitting diode device further includes a phosphor layer formed on one surface in the thickness direction of the light emitting diode element.

According to the method for producing the light emitting diode device of the present invention using the reflecting resin sheet of the present invention, the reflecting resin sheet is laminated on the diode board so that the reflecting resin layer is in close contact with the side surface of the light emitting diode element.

Therefore, in the light emitting diode device of the present invention obtained by the above-described method, light emitted from the light emitting diode element is reflected by the reflecting resin layer before being absorbed by another member.

As a result, the extraction efficiency of the light can be improved.

BRIEF DESCRIPTION OF THE DRAWINGS

FIG. 4 shows process drawings for illustrating the steps of preparing the reflecting resin sheet in FIG. 2 (a):
(a) illustrating a step of preparing the first release substrate,
(b) illustrating a step of disposing a mask on the first release substrate, and
(c) illustrating a step of applying a reflecting resin composition onto the first release substrate via the mask and subsequently, removing the mask.

FIG. 8 shows process drawings for illustrating another embodiment (an embodiment in which the reflecting resin layer is directly provided on the diode board) of a method for producing the light emitting diode device of the present invention:
(a) illustrating a step of providing the light emitting diode element in the diode board,
(b) illustrating a step of providing the reflecting resin layer on the diode board, and
(c) illustrating a step of pressing the reflecting resin layer by a pressing board.

DETAILED DESCRIPTION OF THE INVENTION

Figure 1:
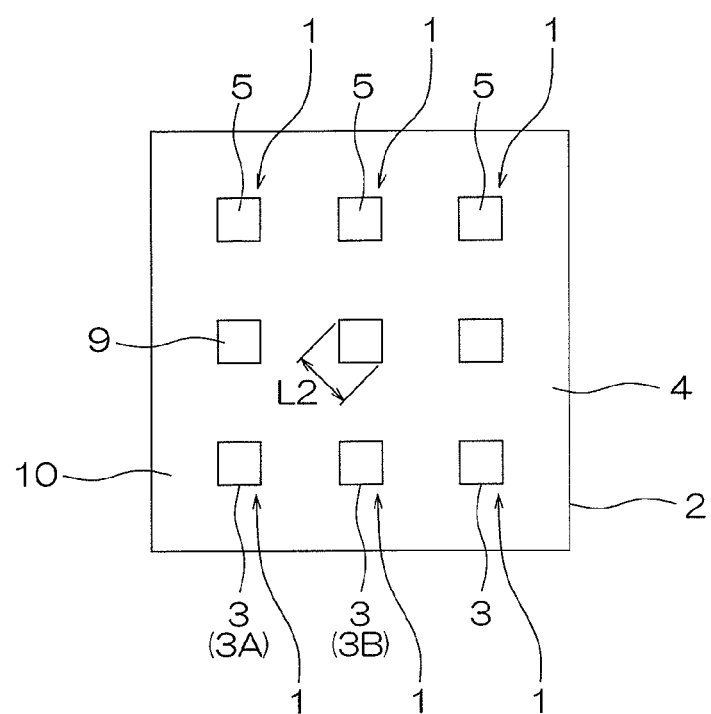
FIG. 1 shows a plan view of one embodiment of a light emitting diode device of the present invention.
Figure 2:
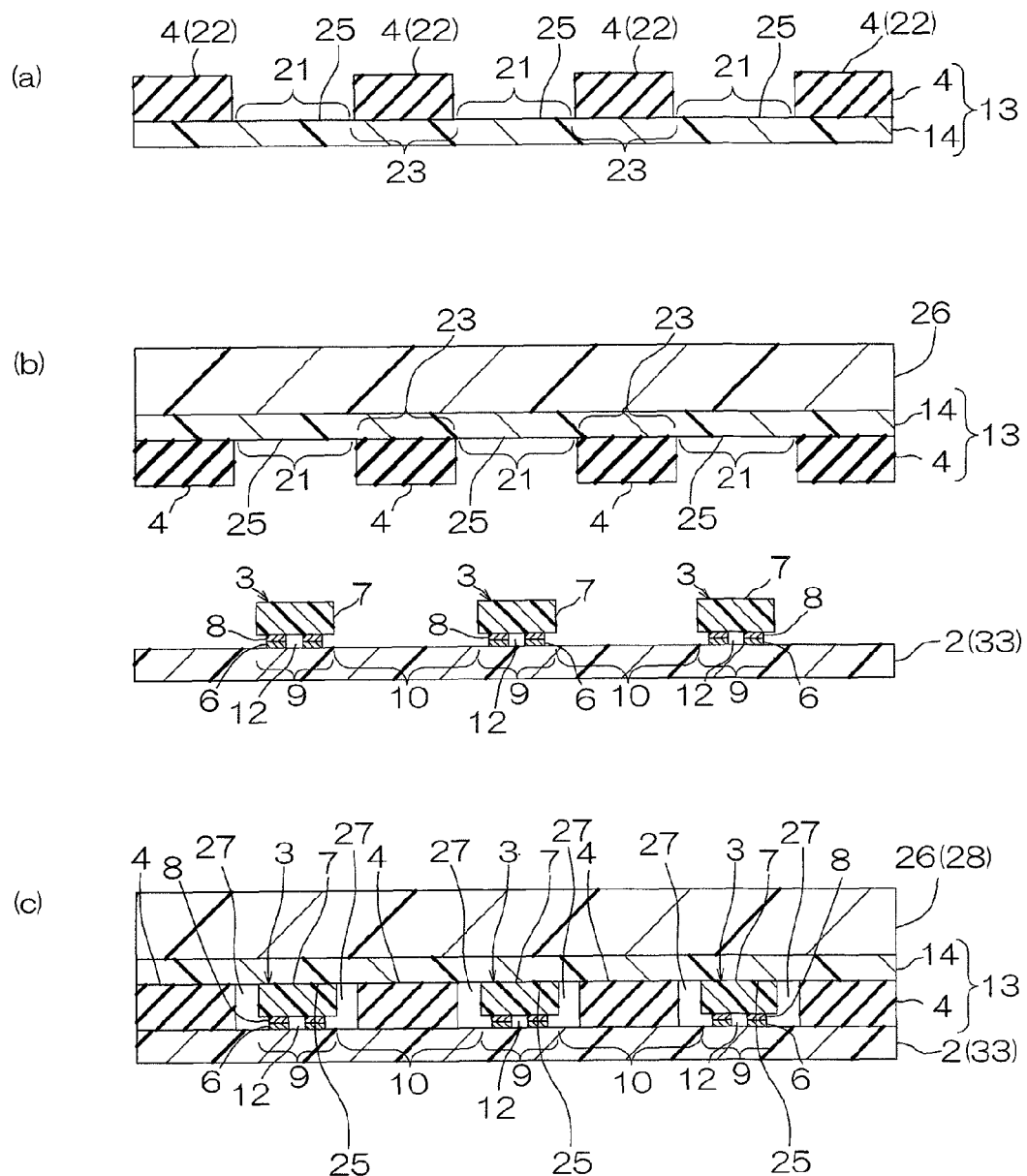
FIG. 2 shows process drawings for illustrating one embodiment of a method for producing the light emitting diode device of the present invention:
(a) illustrating a step of preparing a reflecting resin sheet,
(b) illustrating a step of disposing the reflecting resin sheet on a diode board, and
(c) illustrating a step of allowing an exposed portion to be in contact with the upper surface of a light emitting diode element.
Figure 3:
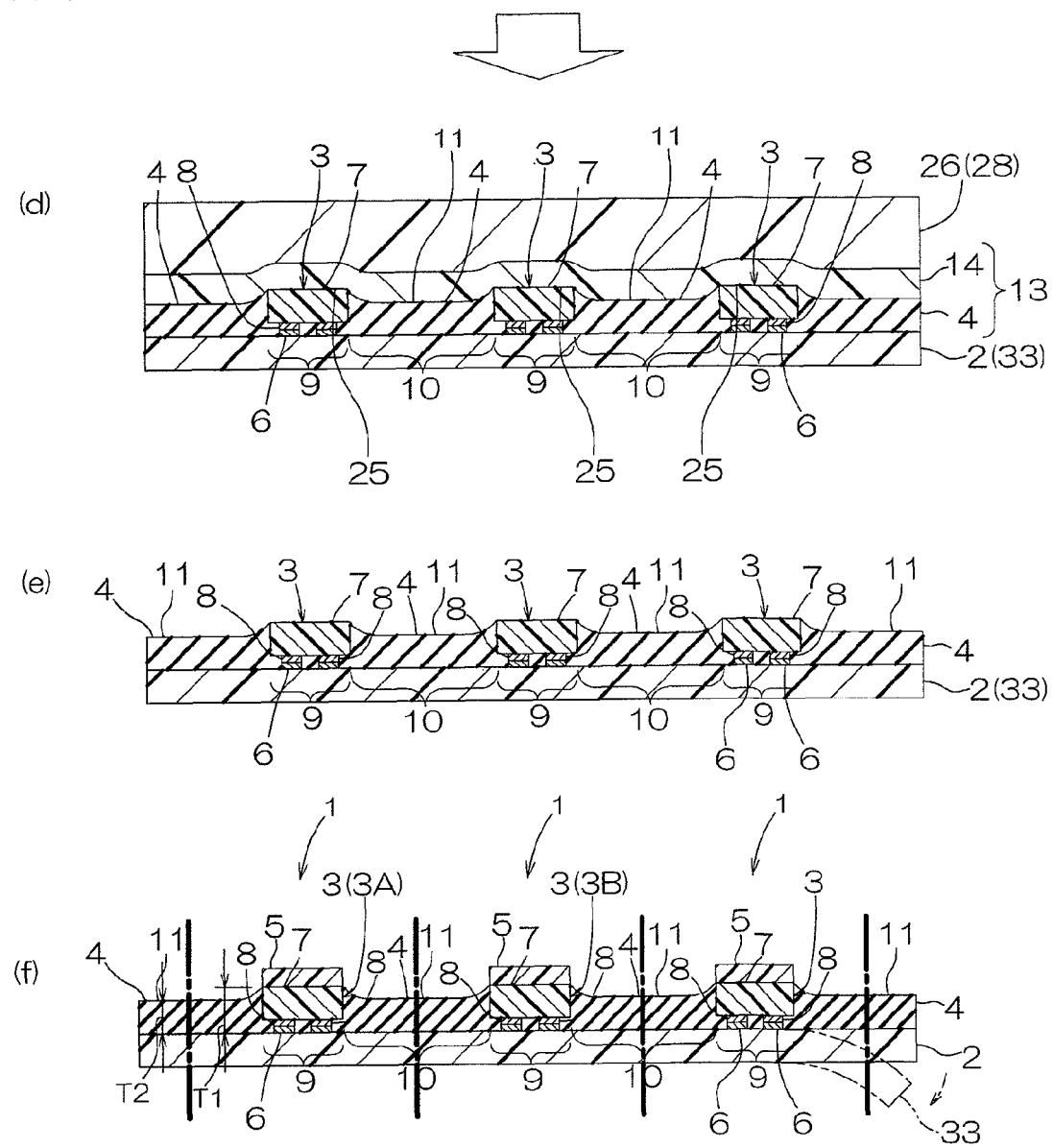
FIG. 3 shows process drawings for illustrating one embodiment of a method for producing the light emitting diode device of the present invention, subsequent to FIG. 2:
(d) illustrating a step of pressing the reflecting resin sheet,
(e) illustrating a step of peeling off a first release substrate, and
(f) illustrating a step of forming a phosphor layer.
Figure 5:
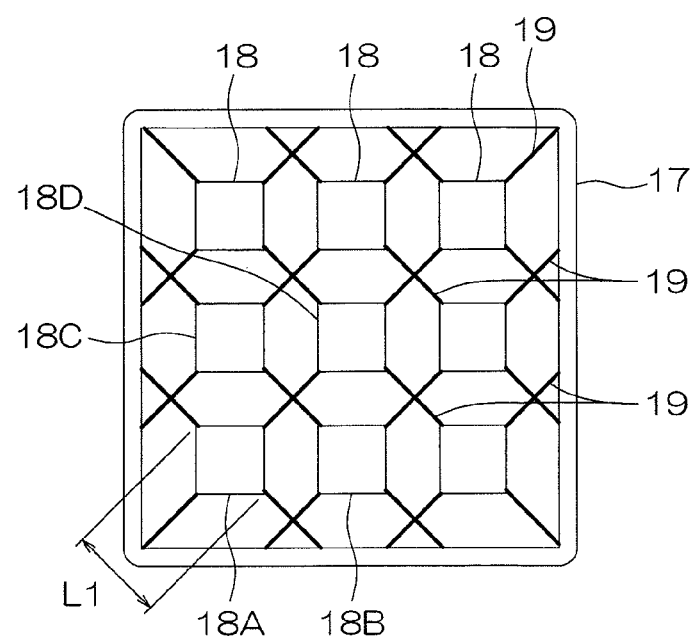
FIG. 5 shows a plan view of the mask disposed in the step in FIG. 4 (b).

FIG. 1 shows a plan view of one embodiment of a light emitting diode device of the present invention. FIGS. 2 and 3 show process drawings for illustrating one embodiment of a method for producing the light emitting diode device of the present invention. FIG. 4 shows process drawings for illustrating the steps of preparing the reflecting resin sheet in FIG. 2 (a). FIG. 5 shows a plan view of the mask disposed in the step in FIG. 4 (b).

In FIGS. 1 and 3 (f), a light emitting diode device 1 includes a diode board 2, a light emitting diode element 3 that is flip mounted on the diode board 2, a reflecting resin layer 4 that is formed at the lateral side of the light emitting diode element 3, and a phosphor layer 5 that is provided on (one side in a thickness direction of) the light emitting diode element 3.

A plurality of the light emitting diode devices 1 are provided at spaced intervals to each other in a plane direction (to be specific, a right-left direction of the paper surface and an up-down direction of the paper surface in FIG. 3 (f)).

The diode board 2 is formed into a generally flat plate shape. To be specific, the diode board 2 is formed of a laminated board in which a conductive layer, as a circuit pattern, is laminated on an insulating board. The insulating board is formed of, for example, a silicon board, a ceramic board, a polyimide resin board, or the like. Preferably, the insulating board is formed of the ceramic board, to be specific, a sapphire ($Al_2O_3$) board. The conductive layer is formed of, for example, a conductor such as gold, copper, silver, or nickel. The conductors can be used alone or in combination.

The conductive layer includes a terminal 6.

The terminals 6 are formed at spaced intervals in the plane direction on the upper surface of the insulating board and are formed into a pattern corresponding to an electrode portion 8 to be described later. Although not shown, the terminal 6 is electrically connected to an electric power supply portion via the conductive layer.

The light emitting diode element 3 is provided on the upper surface (one surface in the thickness direction) of the diode board 2 and is formed into a generally rectangular shape in plane view. A plurality of the light emitting diode elements 3 are, on the upper surface of one piece of the diode board 2, provided at spaced intervals to each other in the plane direction.

The light emitting diode element 3 includes a light semiconductor layer 7 and the electrode portion 8 that is formed on the lower surface thereof.

The light semiconductor layer 7 is formed into a generally rectangular shape in plane view corresponding to the outer shape of the light emitting diode element 3 and is formed into a generally rectangular shape in sectional view that is long in the plane direction.

Although not shown, for example, the light semiconductor layer 7 includes a buffer layer, an N-type semiconductor layer, a light emitting layer, and a P-type semiconductor layer that are sequentially laminated in the thickness direction. The light semiconductor layer 7 is formed of a known semiconductor material and is formed by a known growth method such as an epitaxial growth method. The light semiconductor layer 7 has a thickness in the range of, for example, 0.1 to 500 μm, or preferably 0.2 to 200 μm.

The electrode portion 8 is electrically connected to the light semiconductor layer 7 and is formed so as to be included in the light semiconductor layer 7 when projected in the thickness direction. The electrode portion 8 includes, for example, an anode electrode that is connected to the P-type semiconductor layer and a cathode electrode that is formed in the N-type semiconductor layer.

The electrode portion 8 is formed of a known conductive material and has a thickness in the range of, for example, 10 to 1000 nm.

The reflecting resin layer 4 is, on the upper surface of the diode board 2, formed in a region (a board-side reflecting region) 10 other than a region (a board-side diode region) 9 where the light emitting diode elements 3 are formed in plane view.

The board-side reflecting region 10 is, around the board-side diode region 9, a region that is defined at the outer side thereof by the board-side diode region 9. The board-side reflecting region 10 is formed of a region extending in a front-rear direction and a region extending in the right-left direction, and is formed into a generally grid shape in plane view where the regions are perpendicular (intersectional) to each other.

The reflecting resin layer 4 is provided at the outer side of the light emitting diode element 3, to be specific, at the both outer sides in the right-left direction and the both outer sides in the front-rear direction of each of the light emitting diode elements 3.

As shown in FIG. 3 (f), the reflecting resin layer 4 is in close contact with the outer side surfaces of the light emitting diode element 3, to be specific, each of the surfaces of the left surface, the right surface, the front surface (ref: FIG. 1), and the rear surface (ref: FIG. 1) of each of the light emitting diode elements 3. In this way, the reflecting resin layer 4 exposes the upper surface of the light emitting diode element 3.

As shown in FIG. 1, the reflecting resin layer 4 is integrally formed to be continuous. Therefore, for example, as shown in FIG. 3 (f), in the reflecting resin layer 4 formed between two pieces of the light emitting diode elements 3 (3A and 3B) that are disposed at spaced intervals to each other in the right-left direction, the left end portion thereof is in close contact with the right end surface of a light emitting diode element 3A disposed at the left side of the reflecting resin layer 4 and the right end portion thereof is in close contact with the left end surface of a light emitting diode element 3B disposed at the right side of the reflecting resin layer 4. As referred in FIG. 1, in the same manner as the description above, the reflecting resin layer 4 formed between two pieces of the light emitting diode elements 3 that are disposed at spaced intervals to each other in the front-rear direction is in close contact with the front surface and the rear surface of the light emitting diode elements 3, respectively. To be specific, the front end portion and the rear end portion of the reflecting resin layer 4 are respectively in close contact with the front surface and the rear surface of the light emitting diode elements 3 that are respectively disposed at the front side and the rear side of the reflecting resin layer 4.

As shown in FIG. 3 (f), a resin concave portion 11, which is formed by a pressing (ref: an arrow in FIG. 3 (d)) of a reflecting resin sheet 13 to be described later, is formed at the upper surface of the reflecting resin layer 4.

That is, in the reflecting resin layer 4, the upper surface of the resin concave portion 11 is formed into a flat state and a portion formed at the circumference end portion of the light emitting diode element 3 is formed to be higher than the resin concave portion 11.

The above-described reflecting resin layer 4 contains, for example, a light reflecting component. To be specific, the reflecting resin layer 4 is formed of a reflecting resin composition that contains a resin and the light reflecting component.

An example of the resin includes a thermosetting resin such as thermosetting silicone resin, epoxy resin, thermosetting polyimide resin, phenol resin, urea resin, melamine resin, unsaturated polyester resin, diallyl phthalate resin, and thermosetting urethane resin. Preferably, the thermosetting silicone resin or the epoxy resin is used.

The light reflecting component is, for example, a white compound. To be specific, an example of the white compound includes a white pigment.

An example of the white pigment includes a white inorganic pigment. Examples of the white inorganic pigment include an oxide such as titanium oxide, zinc oxide, and zirconium oxide; a carbonate such as white lead (lead carbonate) and calcium carbonate; and a clay mineral such as kaolin (kaolinite).

As the white inorganic pigment, preferably, the oxide is used or more preferably, the titanium oxide is used.

The titanium oxide can have characteristics such as a high degree of whiteness, a high light reflectivity, excellent hiding characteristics (hiding power), excellent coloring characteristics (coloring power), a high dispersibility, an excellent weather resistance, and a high chemical stability.

To be specific, the titanium oxide is $TiO_2$ (titanium oxide (IV), titanium dioxide).

A crystal structure of the titanium oxide is not particularly limited. For example, the crystal structure thereof is rutile, brookite (pyromelane), anatase (octahedrite), or the like. Preferably, the crystal structure thereof is rutile.

A crystal system of the titanium oxide is not particularly limited. For example, the crystal system thereof is a tetragonal system, an orthorhombic system, or the like. Preferably, the crystal system thereof is the tetragonal system.

When the crystal structure and the crystal system of the titanium oxide are rutile and the tetragonal system, respectively, it is possible to effectively prevent a reduction of the reflectance with respect to light (to be specific, visible light, among all, the light around the wavelength of 450 nm) even in a case where the reflecting resin layer 4 is exposed to a high temperature for a long time.

The light reflecting component is in the form of a particle. The shape thereof is not limited and examples of the shape thereof include, for example, a sphere shape, a plate shape, and a needle shape. An average value of the maximum length (in a case of the sphere shape, the average particle size) of the light reflecting component is in the range of, for example, 1 to 1000 nm. The average value of the maximum length is measured by using a laser diffraction scattering particle size analyzer.

The mixing ratio of the light reflecting component per 100 parts by mass of the resin is, for example, 0.5 to 90 parts by mass, or preferably 1.5 to 70 parts by mass from the viewpoint of the coloring characteristics, the light reflectivity, and handling ability of the reflecting resin composition.

The above-described light reflecting component is uniformly dispersed and mixed into the resin.

In addition, a filler can further be added into the reflecting resin composition. That is, the filler can be used in combination with the light reflecting component (to be specific, the white pigment).

An example of the filler includes a known filler, except for the above-described white pigment. To be specific, an inorganic filler is used. Examples thereof include silica powder, talc powder, alumina powder, aluminum nitride powder, and silicon nitride powder.

Preferably, as the filler, the silica powder is used from the viewpoint of reducing a linear expansion coefficient of the reflecting resin layer 4.

Examples of the silica powder include fused silica powder and crystalline silica powder. Preferably, the fused silica powder (that is, silica glass powder) is used.

Examples of the shape of the filler include, for example, a sphere shape, a plate shape, and a needle shape. Preferably, the sphere shape is used from the viewpoint of excellent filling characteristics and fluidity.

Therefore, preferably, the fused silica powder in a sphere shape is used as the silica powder.

The average value of the maximum length (in a case of the sphere shape, the average particle size) of the filler is in the range of, for example, 5 to 60 μm, or preferably 15 to 45 μm. The average value of the maximum length is measured by using the laser diffraction scattering particle size analyzer.

The addition ratio of the filler is adjusted so that the total amount of the filler and the light reflecting component per 100 parts by mass of the resin is, for example, 10 to 80 parts by mass. And the addition ratio of the filler is adjusted so that the total amount of the filler and the light reflecting component per 100 parts by mass of the resin is preferably 25 to 75 parts by mass, or more preferably 40 to 60 parts by mass from the view point of reducing the linear expansion coefficient and ensuring the fluidity.

The above-described resin, light reflecting component, and filler, which is added as required, are blended to be uniformly mixed, so that the reflecting resin composition is prepared.

The reflecting resin composition is prepared in a B-stage state.

The reflecting resin composition is formed, for example, in a state of liquid or semi-solid and has a kinetic viscosity in the range of, for example, 10 to 30 mm$^2$/s.

In this way, the outer side surfaces of the light emitting diode element 3 are encapsulated by the reflecting resin layer 4.

At the lower side of the light semiconductor layer 7, a lower space 12 (ref: FIG. 2 (b)) corresponding to the thickness of the electrode portion 8 is formed. The reflecting resin layer 4 is filled in the lower space 12, and the reflecting resin layer 4 is in close contact with the lower surface of the light semiconductor layer 7 exposed from the electrode portion 8 and the side surfaces of the electrode portion 8.

As shown in FIG. 3 (f), a thickness T1 of the end portion of the reflecting resin layer 4 is the same as the above-described thickness of the light emitting diode element 3 (the total thickness of the light semiconductor layer 7 and the electrode portion 8). A thickness T2 of the central portion of the reflecting resin layer 4 with respect to the thickness T1 of the end portion is in the range of, for example, 50% or more, preferably 90% or more, or more preferably 95% or more, and usually less than 100% and to be specific, in the range of, for example, 10 to 500 μm, or preferably 15 to 500 μm.

The phosphor layer 5 is formed on the entire surface of the upper surface (one surface in the thickness direction) of the light emitting diode element 3 and is formed into the same pattern as that of the outer shape of the light emitting diode element 3 when projected in the thickness direction.

The phosphor layer 5 is formed of, for example, a phosphor composition that contains a phosphor.

Preferably, the phosphor composition contains the phosphor and the resin.

An example of the phosphor includes a yellow phosphor that is capable of converting blue light into yellow light. An example of the phosphor includes a phosphor obtained by doping a metal atom such as cerium (Ce) or europium (Eu) into a composite metal oxide, a metal sulfide, or the like.

To be specific, examples of the phosphor include garnet type phosphor having a garnet type crystal structure such as $Y_3Al_5O_{12}$:Ce (YAG (yttrium aluminum garnet):Ce), (Y, Gd)$_3$Al$_5$O$_{12}$:Ce, Tb$_3$Al$_3$O$_{12}$:Ce, Ca$_3$Sc$_2$Si$_3$O$_{12}$:Ce, and Lu$_2$CaMg$_2$(Si, Ge)$_3$O$_{12}$:Ce; silicate phosphor such as (Sr, Ba)$_2$SiO$_4$:Eu, Ca$_3$SiO$_4$Cl$_2$:Eu, Sr$_3$SiO$_5$:Eu, Li$_2$SrSiO$_4$:Eu, and Ca$_3$Si$_2$O$_7$:Eu; aluminate phosphor such as CaAl$_{12}$O$_{19}$: Mn and SrAl$_2$O$_4$:Eu; sulfide phosphor such as ZnS:Cu,Al, CaS:Eu, CaGa$_2$S$_4$:Eu, and SrGa$_2$S$_4$:Eu; oxynitride phosphor such as CaSi$_2$O$_2$N$_2$:Eu, SrSi$_2$O$_2$N$_2$:Eu, BaSi$_2$O$_2$N$_2$:Eu, and Ca-α-SiAlON; nitride phosphor such as CaAlSiN$_3$:Eu and CaSi$_5$N$_8$:Eu; and fluoride-based phosphor such as K$_2$SiF$_6$: Mn and K$_2$TiF$_6$:Mn. Preferably, garnet type phosphor is used, or more preferably, Y$_3$Al$_5$O$_{12}$:Ce (YAG) is used.

The phosphors can be used alone or in combination of two or more.

The mixing ratio of the phosphor is, for example, 1 to 50 mass %, or preferably 5 to 30 mass % with respect to the phosphor composition. The mixing ratio of the phosphor is, for example, 1 to 100 parts by mass, or preferably 5 to 40 parts by mass per 100 parts by mass of a resin.

The resin is a matrix in which the phosphor is dispersed, including, for example, transparent resins such as silicone resin, epoxy resin, and acrylic resin. Preferably, the silicone resin is used from the viewpoint of durability.

The silicone resin has, in its molecule, a main chain mainly composed of the siloxane bond (—Si—O—Si—) and a side chain, which is bonded to silicon atoms (Si) of the main chain, composed of an organic group such as an alkyl group (for example, a methyl group and the like) or an alkoxyl group (for example, a methoxy group).

To be specific, examples of the silicone resin include dehydration condensation type silicone resin, addition reaction type silicone resin, peroxide curable silicone resin, moisture curable silicone resin, and curable silicone resin. Preferably, the addition reaction type silicone resin is used.

The silicone resin has a kinetic viscosity at 25° C. in the range of, for example, 10 to 30 mm$^2$/s.

The resins can be used alone or in combination of two or more.

The mixing ratio of the resin is, for example, 50 to 99 mass %, or preferably 70 to 95 mass % with respect to the phosphor composition.

The phosphor and the resin are blended at the above-described mixing ratio and are stirred and mixed, so that the phosphor composition is prepared.

Next, a method for producing the above-described light emitting diode device 1 is described with reference to FIGS. 2 to 5.

In this method, as shown in FIG. 2 (*a*), the reflecting resin sheet 13 is first prepared.

The reflecting resin sheet 13 is a transfer sheet for providing the reflecting resin layer 4 on the lateral sides of the light emitting diode element 3. The reflecting resin sheet 13 is formed into a pattern of being capable of being in close contact with the light emitting diode element 3 in a pressing to be described later (FIG. 3 (*d*)) corresponding to the above-described light emitting diode element 3.

The reflecting resin sheet 13 includes a first release substrate 14 as a release substrate and the reflecting resin layer 4 that is provided on the upper surface (one surface in the thickness direction) thereof.

The reflecting resin sheet 13 can be obtained by allowing the reflecting resin layer 4 to be provided on the upper surface of the first release substrate 14.

To provide the reflecting resin layer 4 on the upper surface of the first release substrate 14, as shown in FIG. 4 (*a*), the first release substrate 14 is first prepared.

The first release substrate 14 is, for example, a release sheet (a release film) in a generally rectangular shape and the upper surface and the lower surface thereof are formed into a flat state.

The first release substrate 14 is formed of a resin material and the like such as a vinyl polymer including polyolefin (to be specific, polyethylene and polypropylene) and ethylene-vinyl acetate copolymer (EVA); a polyester including polyethylene terephthalate and polycarbonate; and a fluorine resin including polytetrafluoroethylene. The first release substrate 14 is also formed of a metal material such as iron, aluminum, or stainless steel.

The first release substrate 14 can also be formed of a thermal release sheet that can be easily peeled off from the reflecting resin layer 4 by being heated. As shown in phantom lines in FIG. 4 (*a*), for example, the thermal release sheet includes a supporting layer 15 and a pressure-sensitive adhesive layer 16 that is laminated on the upper surface of the supporting layer 15.

The supporting layer 15 is formed of, for example, a heat resistant resin such as polyester.

The pressure-sensitive adhesive layer 16 is formed of, for example, a thermally expandable pressure-sensitive adhesive and the like, which has adhesion under normal temperature (25° C.), and in which the adhesion is reduced (or lost) at the time of being heated.

A commercially available product can be used as the above-described thermal release sheet. To be specific, REVALPHA (a trade name, manufactured by NITTO DENKO CORPORATION) and the like can be used.

The thermal release sheet reliably supports the reflecting resin layer 4 by the supporting layer 15 via the pressure-sensitive adhesive layer 16 and is peeled off from the reflecting resin layer 4 due to a reduction in the adhesion of the pressure-sensitive adhesive layer 16 by the heating and thermal expansion performed thereafter.

The first release substrate 14 has a thickness in the range of, for example, 10 to 1000 μm.

Next, as shown in FIG. 4 (*b*), a mask 20 is disposed on the first release substrate 14 (one side in the thickness direction).

As shown in FIG. 5, the mask 20 is formed into a pattern of integrally including a frame portion 17, a covering portion 18 that is disposed at spaced intervals to the inner side of the frame portion 17 in the plane direction, and a bridge portion 19 that is disposed between the frame portion 17 and the covering portion 18.

The frame portion 17 is formed into a generally rectangular frame shape in plane view. The frame portion 17 is formed to have a width that can support the covering portion 18 via the bridge portion 19 (a width capable of ensuring strength).

A plurality of the covering portions 18 are disposed at spaced intervals to each other so as to correspond to the above-described light emitting diode elements 3 (ref: FIG. 1). That is, each of the covering portions 18 is formed independently.

The outer shape of the covering portion 18 is formed into a similar shape (to be specific, a generally rectangular shape in plane view) having a size slightly larger than that of the light emitting diode element 3 in plane view. A maximum length L1 of the covering portion 18 is in the range of L2 (a maximum length of the light emitting diode element 3)+0.22 mm or less, or preferably L2+0.15 mm or less, and usually, for example, L2 or more and to be specific, in the range of, for example, 0.3 to 3 mm, or preferably 0.42 to 2.1 mm.

The bridge portion 19 is disposed between the frame portion 17 and the covering portion 18, and is also disposed between the covering portions 18 that are adjacent to each other in the plane direction. Each of the bridge portions 19 is formed into a generally X-shape in plane view and is, for example, disposed between four pieces of the covering portions 18 (18A, 18B, 18C, and 18D) that are adjacent to each other in the plane direction so as to connect the end portions thereof in the right-left direction and the front-rear direction.

The bridge portion 19 is, for example, formed of a linear member such as a wire. The bridge portion 19 is formed to have a width that is significantly narrow with respect to the maximum length L1 of the covering portion 18. To be specific, the width thereof is in the range of, for example, 100 μm or less, or preferably 50 μm or less, and usually, for example, 25 μm or more.

The mask 20 is formed of, for example, a metal material such as stainless steel and iron or a resin material such as polyethylene terephthalate. Preferably, the mask 20 is formed of the metal material.

The mask 20 is formed into the above-described pattern by, for example, a known pattern forming method such as an etching or a laser processing.

The mask 20 has a thickness in the range of, for example, 20 to 500 μm.

As shown in FIG. 4 (b), the above-described mask 20 is disposed (placed) on the upper surface of the first release substrate 14 so that the covering portion 18 is disposed in opposed relation in the thickness direction to a region (a release-substrate-side diode region) 21 corresponding to the board-side diode region 9 on the upper surface of the first release substrate 14 (ref: FIG. 2 (b)). The covering portion 18 is disposed in opposed relation to the release-substrate-side diode region 21 so that the circumference end portion thereof surrounds the release-substrate-side diode region 21 in plane view.

Next, in this method, as shown in FIG. 4 (c), the reflecting resin composition is applied onto the first release substrate 14 via the mask 20.

In the application of the reflecting resin composition, for example, an application method such as printing and dispenser is used.

In this way, a reflecting film 22 made of the reflecting resin composition is formed on the upper surface of the first release substrate 14 in a pattern reverse to that of the mask 20. The reflecting film 22 is also formed on the upper surface of the mask 20.

Subsequently, as shown by the arrows in the phantom lines in FIG. 4 (c), the mask 20 is removed from the first release substrate 14. To be specific, the mask 20 is pulled toward the upper side.

By pulling the mask 20 toward the upper side, the reflecting film 22 that is formed on the upper surface of the covering portion 18 is removed.

By the above-described pulling up of the mask 20, the reflecting film 22 around the bridge portion 19 (ref: FIG. 5) (to be specific, the reflecting resin composition formed on the side surfaces of the bridge portion 19) slightly moves, so that the region where the bridge portion 19 is disposed is covered (filled in) with the reflecting film 22 without being exposed.

In this way, as shown in FIG. 2 (a), the reflecting film 22 is formed in a pattern (ref: FIG. 2 (b)) reverse to that of the covering portion 18 (ref: FIG. 5). That is, the reflecting film 22 is, on the upper surface of the first release substrate 14, formed in a region (a release-substrate-side reflecting region) 23 corresponding to the board-side reflecting region 10.

The reflecting film 22 in the above-described pattern is heated (described later), so that the reflecting resin layer 4 in the above-described pattern in a B-stage state is obtained.

As referred in FIG. 2 (b) to be described later, the reflecting resin layer 4 is formed in such a pattern that when the reflecting resin sheet 13 is turned over upside down and the turned over reflecting resin sheet 13 is disposed in opposed relation to the diode board 2, the lower surface of the first release substrate 14 exposed from the reflecting resin layer 4 (an exposed portion 25), when projected in the thickness direction, includes the light emitting diode element 3. To be more specific, as referred in FIG. 2 (c) to be described later, the reflecting resin layer 4 is formed in a pattern of being in contact with the diode board 2 when the reflecting resin sheet 13 is laminated on the diode board 2 to be described next.

In this way, the reflecting resin sheet 13 including the reflecting resin layer 4 and the first release substrate 14 is obtained.

Separately, in this method, as shown in the lower portion in FIG. 2 (b), the light emitting diode element 3 is provided on the upper surface (one surface in the thickness direction) of the diode board 2.

To be specific, the electrode portion 8 is electrically connected to the terminal 6 and the light emitting diode element 3 is flip-chip mounted (flip-chip mounting is also called flip mounting) on the diode board 2.

Next, in this method, as shown in FIG. 2 (b), the reflecting resin sheet 13 is disposed in opposed relation to the upper side of the diode board 2.

To be specific, the reflecting resin sheet 13 is first turned over upside down from the state shown in FIG. 2 (a) and subsequently, the reflecting resin layer 4 is disposed so as to be opposed to the board-side reflecting region 10 on the upper surface of the diode board 2.

On the upper surface of the first release substrate 14, a buffer sheet 26 is provided.

The buffer sheet 26 is a sheet (a cushion sheet) that buffers a pressing force so as not to allow the pressing force to non-uniformly apply to the light emitting diode element 3 in the pressing to be described next (ref: the arrow in FIG. 3 (d)). The buffer sheet 26 is formed of, for example, an elastic sheet (film) and the like.

A buffer material for forming the buffer sheet 26 includes the same resin material as that for forming the first release substrate 14 described above. Preferably, the buffer sheet 26 is formed of vinyl polymer, or more preferably, the buffer sheet 26 is formed of EVA.

The buffer sheet 26 has a thickness in the range of, for example, 0.01 to 1 mm, or preferably 0.05 to 0.2 mm.

Next, in this method, as shown in FIGS. 2 (c) and 3 (d), the reflecting resin sheet 13 is laminated on the diode board 2.

That is, as shown in FIG. 2 (c), the lower surface of the reflecting resin layer 4 is first allowed to be in contact with the board-side reflecting region 10 in the diode board 2 and the exposed portion 25 is allowed to be in contact with the upper surface of the light emitting diode element 3.

That is, both of the reflecting resin layer 4 and the light emitting diode element 3 are sandwiched between the first release substrate 14 and the diode board 2 in the thickness direction.

At the time of the contact described above, a minute side space 27 is formed between the reflecting resin layer 4 and the light emitting diode element 3 in the plane direction. The side space 27 is formed as a space that slightly separates the reflecting resin layer 4 from the light emitting diode element 3 in the plane direction.

Subsequently, as shown in the arrow in FIG. 3 (d), the reflecting resin sheet 13 is pressed toward the lower side.

To be specific, the reflecting resin sheet 13 with respect to the diode board 2 is pressed via the buffer sheet 26, for example, with a pressing machine or the like.

The pressure is in the range of, for example, 0.01 to 7 MPa, or preferably 0.05 to 4 MPa.

The above-described pressing can be performed together with heating as required. That is, hot pressing (to be specific, hot pressing in which the pressing is performed with a hot plate) can be performed.

The heating temperature is in the range of, for example, 25 to 140° C.

In this way, the exposed portion 25 of the first release substrate 14 is in close contact with the upper surface (one surface in the thickness direction) of the light emitting diode element 3.

With this, the reflecting resin layer 4 moves toward the side, to be specific, toward the outer side in the plane direction (the left side, the right side, the front side, and the rear side). Therefore, the side space 27 (ref: FIG. 2 (c)) is filled in with the reflecting resin layer 4. The lower space 12 (ref: FIG. 2 (c)) is also filled in with the reflecting resin layer 4.

In this way, the reflecting resin layer 4 is in close contact with the side surfaces (the left surface, the right surface, the front surface, and the rear surface) of the light emitting diode element 3.

The resin concave portion 11 is formed in the reflecting resin layer 4.

Next, as shown in FIG. 3 (e), the first release substrate 14 is peeled off from the reflecting resin layer 4 and the light emitting diode element 3. The first release substrate 14 is removed together with the buffer sheet 26.

In this way, the reflecting resin layer 4 is transferred from the first release substrate 14 to the diode board 2.

Thereafter, the reflecting resin layer 4 in a B-stage state is heated to be cured.

The heating temperature is in the range of, for example, 40 to 150° C., or preferably 50 to 140° C. The heating time is in the range of, for example, 1 to 60 minutes, or preferably 3 to 20 minutes.

Next, as shown in FIG. 3 (f), the phosphor layer 5 is provided on the upper surface of the light emitting diode element 3.

To provide the phosphor layer 5, for example, the above-described phosphor composition is first applied onto the upper surface of the light emitting diode element 3 in the above-described pattern to form a phosphor film (not shown).

Thereafter, the phosphor film is heated, for example, at 50 to 150° C. to be dried, so that the phosphor film is formed into the above-described pattern.

In this way, the light emitting diode device 1 including the diode board 2, the light emitting diode element 3 that is flip mounted on the diode board 2, the reflecting resin layer 4 that is in close contact with the side surfaces of the light emitting diode element 3, and the phosphor layer 5 that is provided on the upper surface of the light emitting diode element 3 is obtained as an assembly sheet.

Thereafter, as shown in dashed lines in FIG. 3 (f), the reflecting resin layer 4 and the diode board 2 that is formed thereunder, which are located between the light emitting diode elements 3, are subjected to a cutting (dicing) process.

That is, the reflecting resin layer 4 and the diode board 2 are subjected to the dicing process along the thickness direction, so that the light emitting diode elements 3 are cut into plural pieces. That is, the light emitting diode elements 3 are individualized (singulated).

According to the above-described method, as shown in FIG. 3 (d), the reflecting resin sheet 13 is laminated on the diode board 2 so that the reflecting resin layer 4 is in close contact with the side surfaces of the light emitting diode element 3.

Therefore, in the light emitting diode device 1 obtained by the above-described method, light emitted from the light emitting diode element 3 is reflected by the reflecting resin layer 4 before being absorbed by another member.

As a result, the extraction efficiency of the light can be improved.

In addition, in the embodiment in FIG. 3 (d), the exposed portion 25 of the first release substrate 14 is allowed to be in close contact with the upper surface of the light emitting diode element 3, so that it is possible to prevent an infiltration (an inflow) of the reflecting resin layer 4 into the upper surface of the light emitting diode element 3. Therefore, as shown in FIG. 3 (f), the phosphor layer 5 can be directly laminated on the upper surface of the light emitting diode element 3.

As a result, it is possible to reliably prevent the light, which is emitted from the light emitting diode element 3 toward the upper side, from being reflected toward the lower side and/or the side by the reflecting resin layer 4, and the light is efficiently converted in wavelength by the phosphor layer 5, so that the extraction efficiency of the light can be improved.

In the embodiments in FIGS. 4 (b) and 4 (c), the reflecting resin layer 4 (ref: FIG. 2 (a)) is formed using the mask 20. Alternatively, for example, when the resin is the thermosetting resin in the form of a powder, as referred in FIG. 2 (a), the resin composition is formed on the entire upper surface of the first release substrate 14 by being heated and subjected to compression molding to be cured with a compression molding machine. Thereafter, the reflecting resin layer 4 can be formed into the above-described pattern by an etching and the like.

On the other hand, when the reflecting resin layer 4 is formed using the mask 20, it is possible to collect the reflecting resin composition, which adheres onto the upper surface of the mask 20 at the time of pulling up the mask 20, as a material, so that the yield rate of the reflecting resin composition can be improved.

In the embodiments in FIGS. 2 (b) to 3 (f), the light emitting diode element 3 is flip mounted on the diode board 2 in advance and the reflecting resin layer 4 is transferred to the diode board 2. Alternatively, for example, as referred in a numeral 33 shown in parentheses in FIGS. 2 (b) to 3 (f), instead of the diode board 2, a second release substrate 33 is first prepared and the light emitting diode element 3 is provided on the upper surface thereof and then the reflecting resin layer 4 is transferred to the second release substrate 33. Thereafter, the light emitting diode element 3 and the reflecting resin layer 4 can be transferred to the diode board 2, which is separately prepared.

In that case, the second release substrate 33 is formed of the same release substrate as that of the first release substrate 14 described above.

In the above-described case, as referred in the numeral 33 shown in parentheses in FIG. 2 (b), the reflecting resin layer 4 is disposed on the second release substrate 33. As referred in FIGS. 2 (c) and 3 (d), the reflecting resin sheet 13 is disposed in opposed relation to the second release substrate 33 and subsequently, is pressed thereto, so that the reflecting resin layer 4 is in close contact with the side surfaces of the light emitting diode element 3.

Thereafter, as referred in FIG. 3 (e), the first release substrate 14 is peeled off from the reflecting resin layer 4 (ref: FIG. 3 (d)) and the light emitting diode element 3 and subsequently, as referred in FIG. 3 (f), the phosphor layer 5 is provided on the upper surface of the light emitting diode element 3.

Next, as shown in the dashed lines in FIG. 3 (f), the reflecting resin layer 4 and the second release substrate 33 are subjected to the dicing process along the thickness direction, so that the light emitting diode elements 3 are individualized (singulated).

Thereafter, as shown in the phantom lines in FIG. 3 (f), the second release substrate 33 is peeled off from the reflecting resin layer 4 and the light emitting diode element 3. Next, the light emitting diode element 3 in which the side surfaces thereof are in close contact with the reflecting resin layer 4 is flip mounted on the diode board 2, which is referred in the lower portion in FIG. 2 (b).

In this way, the light emitting diode device 1 is obtained.

According to the embodiment in which the second release substrate 33 is used, the same function effect as that of the embodiment in which the light emitting diode element 3 is flip mounted on the diode board 2 in advance can be obtained.

Furthermore, in the embodiment in which the second release substrate 33 is used, it is not required that the light emitting diode element 3 is flip mounted on the diode board 2 in advance, so that the side surfaces of the light emitting diode element 3 can be easily in close contact with the reflecting resin layer 4.

On the other hand, in the embodiment in which the light emitting diode element 3 is flip mounted on the diode board 2 in advance, after the side surfaces of the light emitting diode element 3, which is flip mounted on the diode board 2 in advance, are allowed to be in close contact with the reflecting resin layer 4, the light emitting diode element 3 is not required to be separately flip mounted on the diode board 2, so that the light emitting diode device 1 can be easily produced.

In the process of pressing the reflecting resin sheet 13 shown by the arrow in FIG. 3 (d), the reflecting resin sheet 13 with respect to the diode board 2 is pressed via the buffer sheet 26. Alternatively, as referred in a numeral 28 shown in parentheses in FIG. 3 (d), the reflecting resin sheet 13 can be directly hot pressed without providing the buffer sheet 26 (ref: FIG. 2 (c)).

In the hot pressing, as shown in FIG. 3 (d), a hot plate 28 is used instead of the buffer sheet 26 and the first release substrate 14 is pressed with the hot plate 28 to perform the hot pressing.

In the embodiment in which the first release substrate 14 is pressed with the hot plate 28, it is not required that the buffer sheet 26 is provided in advance, so that the production processes can be simplified.

On the other hand, in the embodiment in which the reflecting resin sheet 13 with respect to the diode board 2 is pressed via the buffer sheet 26, a damage of the light emitting diode element 3 caused by a non-uniform pressing force can be effectively prevented.

Figure 6:
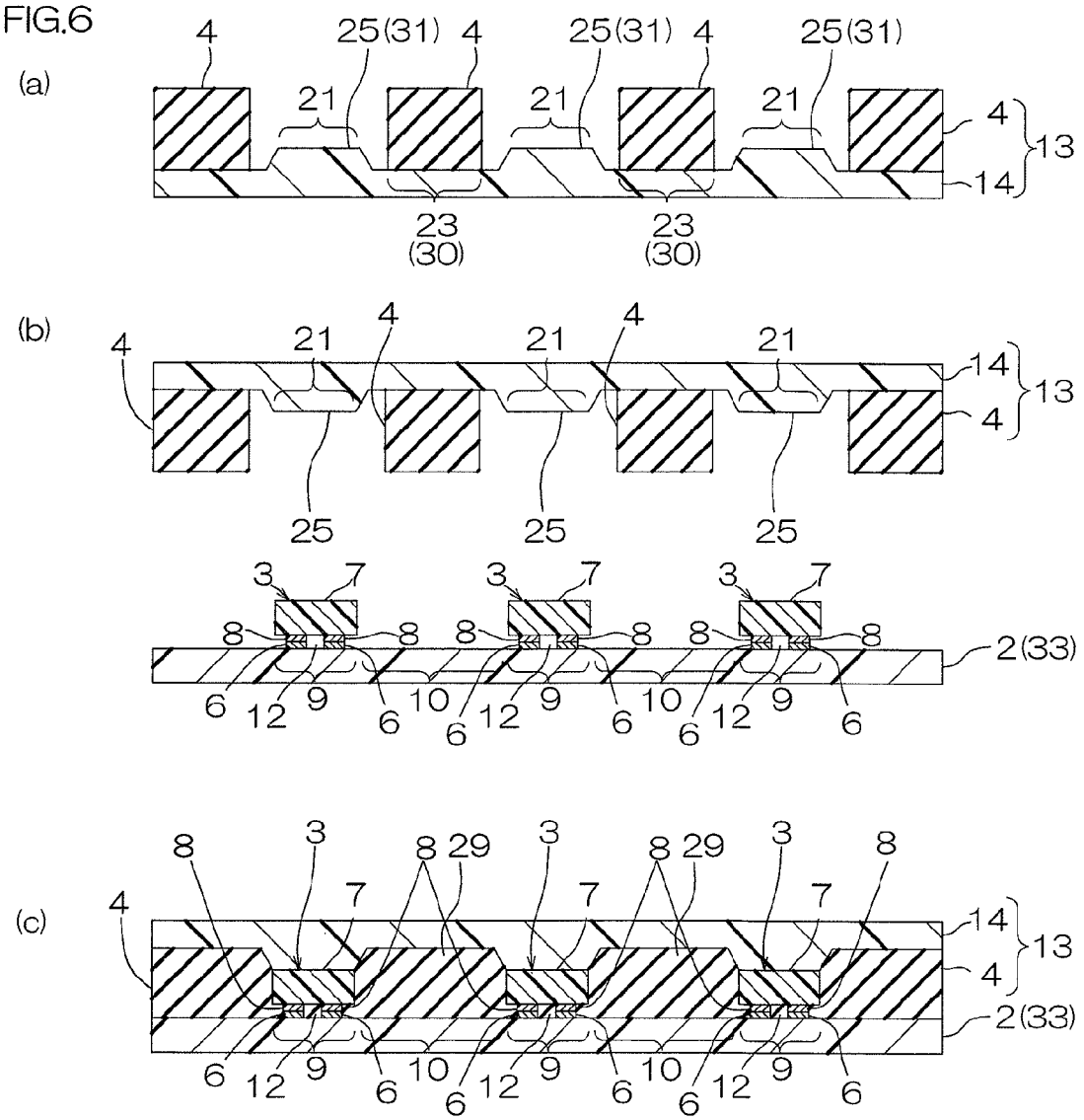
FIG. 6 shows process drawings for illustrating another embodiment (an embodiment in which a concave portion is provided in the first release substrate) of a method for producing the light emitting diode device of the present invention:
(a) illustrating a step of providing a reflecting resin layer in the concave portion in the first release substrate,
(b) illustrating a step of disposing the reflecting resin sheet on the diode board, and
(c) illustrating a step of laminating the reflecting resin sheet on the diode board to be pressed.
Figure 7:
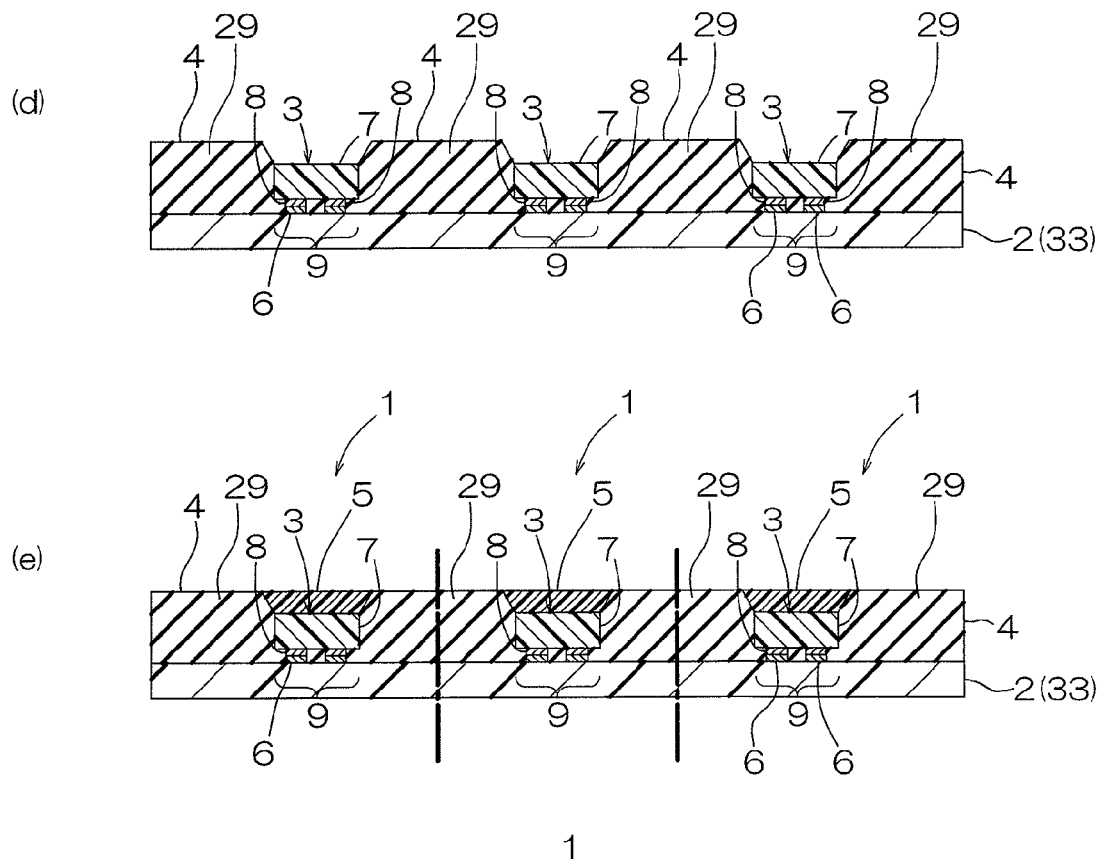
FIG. 7 shows process drawings for illustrating another embodiment (an embodiment in which the concave portion is provided in the first release substrate) of a method for producing the light emitting diode device of the present invention, subsequent to FIG. 6:
(d) illustrating a step of peeling off the first release substrate and
(e) illustrating a step of forming the phosphor layer.

FIGS. 6 and 7 show process drawings for illustrating another embodiment (an embodiment in which a concave portion is provided in the first release substrate) of a method for producing the light emitting diode device of the present invention.

In each figure to be described below, the same reference numerals are provided for members corresponding to each of those described above, and their detailed description is omitted.

In the embodiments in FIGS. 3 (e) and 3 (f), the reflecting resin layer 4 is formed so that the thickness thereof is the same or thinner than that of the light emitting diode element 3. Alternatively, for example, as shown in FIGS. 7 (d) and 7 (e), the reflecting resin layer 4 can be formed so that the thickness thereof is thicker than that of the light emitting diode element 3.

As shown in FIGS. 7 (d) and 7 (e), the reflecting resin layer 4 is formed so that an upper portion 29 protrudes from the light emitting diode element 3 toward the upper side when projected in the plane direction. The corners of the upper portion 29 are chamfered.

The thickness of the upper portion 29 with respect to that of the light emitting diode element 3 is in the range of, for example, 100 to 200%, or preferably 150 to 200% and to be specific, in the range of, for example, 20 to 1000 μm, or preferably 50 to 600 μm.

The phosphor layer 5 is formed, on the light emitting diode element 3, so as to be filled in between the upper portions 29 that are adjacent to the light emitting diode elements 3.

Next, a method for producing the light emitting diode device 1 shown in FIG. 7 (e) is described with reference to FIGS. 6 and 7.

In this method, as shown in FIG. 6 (a), the reflecting resin sheet 13 is first formed.

To form the reflecting resin sheet 13, the first release substrate 14 is first prepared.

In the first release substrate 14, the release-substrate-side reflecting region 23 is formed so as to be dented.

To be specific, on the upper surface (one surface in the thickness direction) of the first release substrate 14, the release-substrate-side reflecting region 23 is defined as a concave portion 30 that is dented toward the lower side (the other side in the thickness direction) and the release-substrate-side diode region 21 is defined as a protruding portion 31 (the exposed portion 25) that protrudes from the circumference end portion of the concave portion 30 toward the upper side.

That is, the first release substrate 14 is formed into a convexo-concave shape in which the protruding portion 31 (the region corresponding to the board-side reflecting region 10, ref: FIG. 1) is disposed into a generally grid shape in plane view and the concave portions 30 (the region corresponding to the board-side diode region 9, ref: FIG. 1) are surrounded by the protruding portion 31.

The first release substrate 14 is formed, for example, by a known molding process such as an embossing process.

Next, as shown in FIG. 6 (a), the reflecting resin layer 4 is provided on the upper surface of the first release substrate 14 according to the same method as the description above.

In this way, the reflecting resin sheet 13 is formed.

Separately, as shown in the lower portion in FIG. 6 (b), the light emitting diode element 3 is flip mounted on the diode board 2. Subsequently, the reflecting resin sheet 13 is disposed in opposed relation to the upper side of the diode board 2.

Next, as shown in FIG. 6 (c), the reflecting resin sheet 13 is laminated on the diode board 2 and subsequently, the reflecting resin sheet 13 is pressed (or hot pressed) with respect to the diode board 2.

By the above-described pressing, the reflecting resin layer 4 is formed so that the corners of the upper portion 29 are chamfered so as to correspond to the shape of the concave portion 30.

Next, as shown in FIG. 7 (d), the first release substrate 14 (ref: FIG. 6 (c)) is peeled off from the reflecting resin layer 4 and the light emitting diode element 3. Thereafter, as shown in FIG. 7 (e), the phosphor layer 5 is, on the upper surface of the light emitting diode element 3, filled in between the upper portions 29 that are adjacent to the light emitting diode elements 3.

In this way, the light emitting diode device 1 is obtained.

In the embodiment shown in FIG. 7 (e), the same function effect as that of the embodiment shown in FIG. 3 (f) can be obtained.

In addition, in the embodiment shown in FIG. 7 (e), the reflecting resin layer 4 is formed so that the thickness thereof is thicker than that of the light emitting diode element 3, so that the light emitted from the light emitting diode element 3 to the side obliquely upward can be reflected by the upper portion 29 in the reflecting resin layer 4.

As a result, the extraction efficiency of the light can be further improved.

Figure 9:
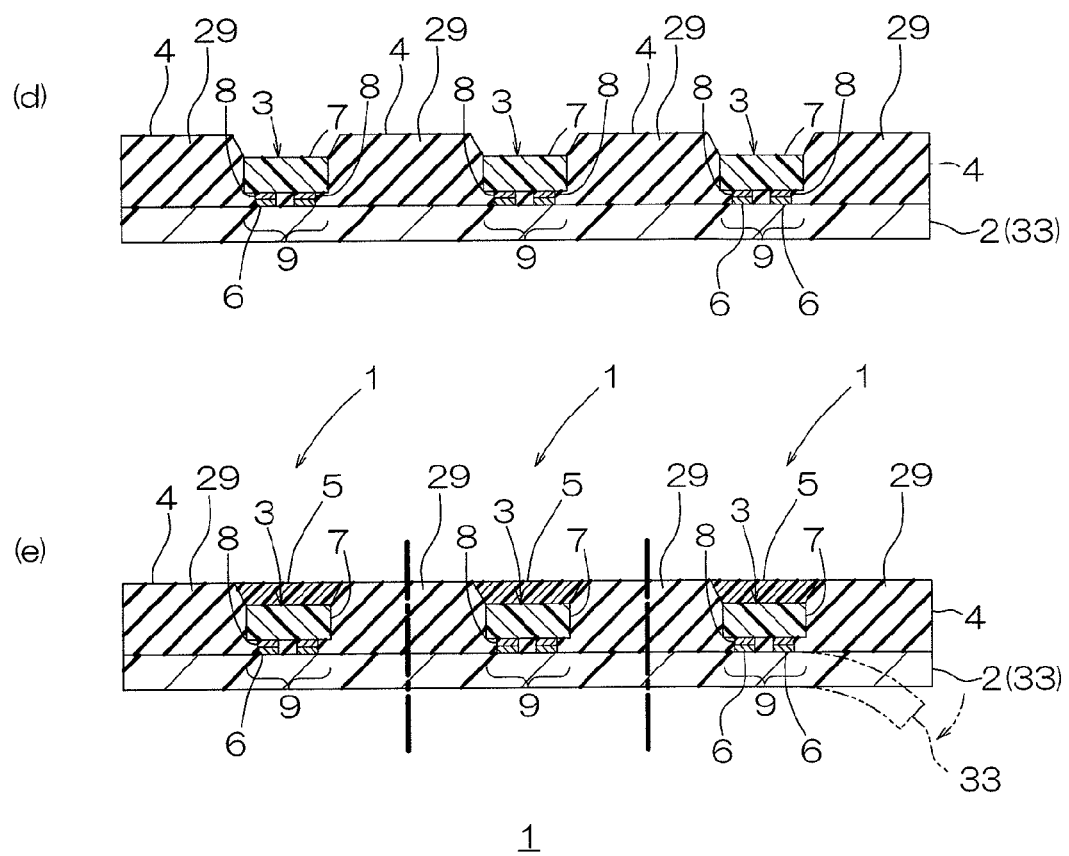
FIG. 9 shows process drawings for illustrating another embodiment (an embodiment in which the reflecting resin layer is directly provided on the diode board) of a method for producing the light emitting diode device of the present invention, subsequent to FIG. 8:
(d) illustrating a step of removing the pressing board and
(e) illustrating a step of providing the phosphor layer.

FIGS. 8 and 9 show process drawings for illustrating another embodiment (an embodiment in which the reflecting resin layer is directly provided on the diode board) of a method for producing the light emitting diode device of the present invention.

In the embodiments in FIGS. 2, 3, 6, and 7, the reflecting resin layer 4 is transferred to the diode board 2 using the reflecting resin sheet (the transfer sheet) 13. Alternatively, for example, as shown in FIGS. 8 and 9, the reflecting resin layer 4 can be directly provided on the diode board 2 without using the reflecting resin sheet (the transfer sheet) 13.

Next, a method for obtaining the light emitting diode device 1 by providing the reflecting resin layer 4 directly on the diode board 2 is described with reference to FIGS. 8 and 9.

In this method, as shown in FIG. 8 (a), the light emitting diode element 3 is first provided on the upper surface (one surface in the thickness direction) of the diode board 2, which serves as a base member.

Next, as shown in FIG. 8 (b), the reflecting resin layer 4 is, on the upper surface (one surface in the thickness direction) of the diode board 2, provided at the side of the light emitting diode element 3, to be specific, at the outer side in the plane direction.

The reflecting resin layer 4 is provided so that the side space 27 is formed between the light emitting diode element 3 and the reflecting resin layer 4 in the plane direction.

To provide the reflecting resin layer 4 on the upper surface of the diode board 2, for example, a method such as an application of the reflecting resin composition via the mask 20 shown in FIG. 5, or a compression molding is used.

Next, in this method, as shown in the phantom lines in FIG. 8 (c), a pressing board 32 as a pressing member is prepared.

The pressing board 32 is formed into the same shape as that of the first release substrate 14 in which the concave portion 30 and the protruding portion 31 are provided, which is shown in FIG. 6 (b).

The pressing board 32 is formed of the same material as that of the first release substrate 14 shown in FIG. 6 (b).

Preferably, the pressing board 32 is formed of a metal material. The metal material can ensure a reliable pressing when the reflecting resin layer 4 is pressed (ref: solid lines in FIG. 8 (c)).

The lower surface of the pressing board 32 can be subjected to a known release treatment (a surface treatment).

As shown in the phantom lines in FIG. 8 (c), the pressing board 32 is disposed above the diode board 2 so that the concave portion 30 is opposed to the reflecting resin layer 4 and the protruding portion 31 is opposed to the light emitting diode element 3.

Next, in this method, as shown by the arrow in the phantom lines and the solid lines in FIG. 8 (c), the reflecting resin layer 4 is pressed by the pressing board 32.

To be specific, the pressing board 32 is lowered toward the diode board 2, so that the protruding portion 31 is in close contact with the upper surface of the light emitting diode element 3 and the concave portion 30 presses the reflecting resin layer 4 toward the lower side.

In this way, the reflecting resin layer 4 comes into close contact with each of the side surfaces of the light emitting diode element 3.

In the reflecting resin layer 4, the upper portion 29 that protrudes from the light emitting diode element 3 toward the upper side is formed into a shape corresponding to the concave portion 30 in the pressing board 32.

Next, as shown in FIG. 9 (d), the pressing board 32 (ref: FIG. 8 (c)) is removed.

Next, as shown in FIG. 9 (e), the phosphor layer 5 is, on the upper surface of the light emitting diode element 3, filled in between the upper portions 29 that are adjacent to the light emitting diode elements 3.

Thereafter, as shown in the dashed lines in FIG. 9 (e), the reflecting resin layer 4 and the diode board 2 are subjected to the dicing process along the thickness direction, so that the light emitting diode elements 3 are individualized (singulated).

In this way, the light emitting diode device 1 is obtained.

In the embodiments in FIGS. 8 and 9, the reflecting resin layer 4 is provided on the diode board 2 so as to be in close contact with the side surfaces of the light emitting diode element 3 without using the transfer sheet (the reflecting resin sheet) 13, so that the production processes can be simplified because of unnecessity of the preparation thereof.

On the other hand, in the embodiments in FIGS. 2, 3, 6, and 7, the reflecting resin layer 4 uses, as a transfer sheet, the reflecting resin sheet 13 that is formed in a predetermined pattern, so that the reflecting resin layer 4 can be reliably and easily provided on the diode board 2 so as to be in close contact with the side surfaces of the light emitting diode element 3.

In the embodiments in FIGS. 8 and 9, as shown in FIG. 8 (a), the base member of the present invention is described as the diode board 2. Alternatively, for example, as referred in the numeral 33 shown in parentheses in FIGS. 8 (a) to 9 (e), the second release substrate 33 is used instead of the diode board 2 and the light emitting diode element 3 can be directly provided on the upper surface thereof.

In that case, as referred in the numeral 33 shown in parentheses in FIG. 8 (a), the light emitting diode element 3 is provided on the upper surface of the second release substrate 33, then as referred in FIG. 8 (b), the reflecting resin layer 4 is laminated on the upper surface of the second release substrate 33, and subsequently as referred in FIG. 8 (c), the pressing board 32 is pressed with respect to the reflecting resin layer 4 toward the lower side, so that the reflecting resin layer 4 is in close contact with the side surfaces of the light emitting diode element 3.

Thereafter, as referred in FIG. 9 (d), the pressing board 32 is removed and subsequently, as referred in FIG. 9 (e), the phosphor layer 5 is provided on the upper surface of the light emitting diode element 3.

Next, as shown in the dashed lines in FIG. 9 (e), the reflecting resin layer 4 and the second release substrate 33 are subjected to the dicing process along the thickness direction, so that the light emitting diode elements 3 are individualized (singulated).

Thereafter, as referred in the phantom lines in FIG. 9 (e), the second release substrate 33 is peeled off from the reflecting resin layer 4 and the light emitting diode element 3 and then, the light emitting diode element 3 in which the side surfaces thereof are in close contact with the reflecting resin layer 4 is flip mounted on the diode board 2, which is referred in FIG. 8 (a).

In this way, the light emitting diode device 1 is obtained.

In the embodiment in which the base member is used as the second release substrate 33, the same function effect as that of the embodiment in which the base member is used as the diode board 2 can be obtained.

In addition, in the embodiment in which the base member is used as the second release substrate 33, it is not required that the light emitting diode element 3 is flip mounted on the diode board 2 in advance, so that the side surfaces of the light emitting diode element 3 can be easily in close contact with the reflecting resin layer 4.

On the other hand, in the embodiment in which the base member is used as the diode board 2, after the side surfaces of the light emitting diode element 3 are allowed to be in close contact with the reflecting resin layer 4, the light emitting diode element 3 is not required to be separately flip mounted on the diode board 2, so that the light emitting diode device 1 can be easily produced.

EXAMPLES

While the present invention will be described hereinafter in further detail with reference to Examples, the present invention is not limited to these Examples.

Example 1

The Embodiments in FIGS. 2 and 3

First, a reflecting resin sheet was prepared (ref: FIG. 2 (a)).

That is, a first release substrate in which the upper surface and the lower surface thereof are formed to be in a flat state made of a fluorine resin having a thickness of 50 μm was prepared (ref: FIG. 4 (a)).

Next, a mask made of stainless steel having a thickness of 100 μm was disposed on the upper surface of the first release substrate (ref: FIG. 4 (b)).

The mask was formed into a pattern of integrally including a frame portion, a covering portion, and a bridge portion (ref: FIG. 5). The covering portion was in a generally rectangular shape in plane view and had a maximum length (L1) of 0.56 mm.

Next, a reflecting resin composition was prepared and the reflecting resin composition was applied onto the first release substrate via the mask by a printing (ref: FIG. 4 (c)).

100 parts by mass of thermosetting silicone resin and 20 parts by mass of a particle of titanium oxide ($TiO_2$: tetragonal system of rutile) in a sphere shape having an average particle size of 300 nm were uniformly mixed, so that the reflecting resin composition was prepared.

In this way, a reflecting film made of the reflecting resin composition was formed in a pattern reverse to that of the mask.

Subsequently, the mask was removed from the first release substrate (ref: arrows in phantom lines in FIG. 4 (c)). In this way, the reflecting film around the bridge portion slightly moved, so that the reflecting film was disposed in the region where the bridge portion was disposed. In this way, the reflecting film was formed in a pattern reverse to that of the covering portion. The reflecting film was in a B-stage state.

In this way, a reflecting resin sheet (a transfer sheet) including the first release substrate and a reflecting resin layer made of the reflecting film was formed.

Next, the first release substrate was turned over upside down and a buffer sheet made of EVA having a thickness of 0.12 mm was provided on the upper surface of the first release substrate (ref: FIG. 2 (b)).

Separately, a light emitting diode element, including a light semiconductor layer including the buffer layer (GaN); an N-type semiconductor layer (n-GaN); a light emitting layer (InGaN); and a P-type semiconductor layer (p-GaN: Mg) and an electrode portion including an anode electrode and a cathode electrode having a thickness of 0.1 mm and a maximum length (L2) of 0.42 mm, was flip mounted on the upper surface of a diode board having a thickness of 1 mm (ref: the lower portion in FIG. 2 (b)). The diode board included an insulating board made of sapphire and a conductive layer including a terminal made of copper, nickel, and gold on the upper surface thereof.

Next, the reflecting resin sheet was laminated on the diode board (ref: FIGS. 2 (c) and 3 (d)).

To be specific, the lower surface of the reflecting resin layer was allowed to be in contact with a board-side reflecting region in the diode board and an exposed portion was allowed to be in contact with the upper surface of the light emitting diode element (ref: FIG. 2 (c)).

Next, the reflecting resin sheet was pressed toward the lower side (ref: the arrow in FIG. 3 (d)). To be specific, the reflecting resin sheet with respect to the diode board was pressed via the buffer sheet at a pressure of 0.3 MPa with a pressing machine.

In this way, the exposed portion of the first release substrate came into close contact with the upper surface of the light emitting diode element and the reflecting resin layer came into close contact with the side surfaces of the light emitting diode element.

A resin concave portion was formed in the central portion on the upper surface of the reflecting resin layer. The resin concave portion had a thickness (T2) of 90 μm.

Next, the first release substrate was removed from the reflecting resin layer and the light emitting diode element together with the buffer sheet (ref: FIG. 3 (e)).

In this way, the reflecting resin layer was transferred from the first release substrate to the diode board.

Thereafter, the reflecting resin layer was cured by being heated.

Next, a phosphor layer was provided on the upper surface of the light emitting diode element (ref: FIG. 3 (f)).

To be specific, 26 parts by mass of phosphor particles composed of $Y_3Al_5O_{12}$:Ce (in a sphere shape, the average particle size of 8 μm) and 74 parts by mass of a silicone resin (addition reaction type silicone resin, kinetic viscosity (at 25° C.) of 20 mm²/S, manufactured by WACKER ASA- HIKASEI SILICONE CO., LTD.) were blended and stirred uniformly, so that a phosphor composition was prepared.

Next, the prepared phosphor composition was applied onto the upper surface of the light emitting diode element by a printing to form a phosphor film. Thereafter, the phosphor film was dried at 100° C. to form the phosphor layer.

Thereafter, the reflecting resin layer and the diode board were subjected to a dicing process along a thickness direction, so that a light emitting diode device including the diode board, the light emitting diode element, the reflecting resin layer, and the phosphor layer was produced (ref: dashed lines in FIG. 3 (f)).

Example 2

The Embodiments in FIGS. 6 and 7

A light emitting diode device was produced in the same manner as in Example 1 except that a concave portion and a protruding portion were formed on the upper surface of the first release substrate (ref: FIG. 6 (a)) and the buffer sheet was not provided on the upper surface of the first release substrate.

That is, in the reflecting resin sheet, the reflecting resin layer was formed in the concave portion in the first release substrate (ref: FIG. 6 (a)) and subsequently, the light emitting diode element was flip mounted on the diode board (ref: FIG. 6 (b)). Next, the reflecting resin sheet was laminated on the diode board and then, the reflecting resin sheet was pressed with respect to the diode board (ref: FIG. 6 (c)).

In this way, an upper portion of the reflecting resin layer was formed into a taper shape corresponding to the concave portion.

Next, the first release substrate was peeled off from the reflecting resin layer and the light emitting diode element (ref: FIG. 7 (d)) and then, the phosphor layer was, on the upper surface of the light emitting diode element, filled in between the upper portions that were adjacent to the light emitting diode elements (ref: FIG. 7 (e)).

Thereafter, the reflecting resin layer and the diode board were subjected to the dicing process along the thickness direction, so that the light emitting diode device was produced (ref: the dashed lines in FIG. 7 (e)).

Example 3

The Embodiments in FIGS. 8 and 9

A light emitting diode device was obtained in the same manner as in Example 1 except that the reflecting resin layer was directly provided on the diode board (ref: FIG. 8 (a)) without using the reflecting resin sheet (the transfer sheet) and a pressing board (ref: FIG. 8 (c)) was used in the pressing of the reflecting resin layer (ref: FIG. 9 (e)).

That is, the light emitting diode element was first provided on the upper surface of the diode board (ref: FIG. 8 (a)).

Next, the reflecting resin layer was provided on the upper surface of the diode board using the mask (ref: FIG. 5) so that a side space was formed at the outer side in a plane direction of the light emitting diode element (ref: FIG. 8 (b)).

Next, in this method, the pressing board in which the concave portion and the protruding portion were provided made of stainless steel was prepared (ref: the phantom lines in FIG. 8 (c)).

Subsequently, the reflecting resin layer was pressed by the pressing board (ref: the arrow in the phantom lines and solid lines in FIG. 8 (c)).

In this way, the reflecting resin layer was allowed to be in close contact with each of the side surfaces of the light emitting diode element and was formed, in the upper portion of the reflecting resin layer, into a shape corresponding to the concave portion in the pressing board.

Next, the pressing board was removed (ref: FIG. 9 (d)) and then the phosphor layer was, on the upper surface of the light emitting diode element, filled in between the upper portions that were adjacent to the light emitting diode elements (ref: FIG. 9 (e)).

Thereafter, the reflecting resin layer and the diode board were subjected to the dicing process along the thickness direction, so that the light emitting diode elements were singulated to obtain the light emitting diode device (ref: the dashed lines in FIG. 9 (e)).

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A light emitting diode device comprising:
   a diode board,
   a light emitting diode element provided on one surface in a thickness direction of the diode board,
   a reflecting resin layer that is in direct contact with the side surface of the light emitting diode element and exposing one surface in a thickness direction of the light emitting diode element, and
   a phosphor layer formed directly on the one surface in the thickness direction of the light emitting diode element,
   wherein the reflecting resin layer is formed of a reflecting resin composition that contains a resin and a particulate light reflecting component,
   the phosphor layer is formed into the same shape and size as that of the outer shape of the light emitting diode element when projected in the thickness direction, or the phosphor layer is formed into a tapered shape extending toward one side in the thickness direction, and
   another surface in the thickness direction of the phosphor layer is formed into the same shape and size as the outer shape of the light emitting diode element.

2. The light emitting diode device according to claim 1, wherein the reflecting resin layer is formed so that the thickness thereof is thicker than that of the light emitting diode element.

3. The light emitting diode device according to claim 1, wherein the reflecting resin layer is, on one surface in the thickness direction of the diode board, formed in a reflecting region that is the entire region other than a diode region where the light emitting diode elements are formed.

4. The light emitting diode device according to claim 1, wherein the reflecting resin layer is in direct contact with the entire side surface of the light emitting diode element.

5. The light emitting diode device according to claim 1, wherein the phosphor layer is formed into the same shape and size as that of the outer shape of the light emitting diode element when projected in a thickness direction, and
   an upper surface and side surfaces of the phosphor layer are exposed.

* * * * *